United States Patent
Fayet et al.

(10) Patent No.: US 7,806,981 B2
(45) Date of Patent: Oct. 5, 2010

(54) METHOD FOR THE TREATMENT OF A WEB-TYPE MATERIAL IN A PLASMA-ASSISTED PROCESS

(75) Inventors: Pierre Fayet, Lausanne (CH); Bertrand Jaccoud, Siviriez (CH)

(73) Assignee: Tetra Laval Holdings & Finance S.A., Pully (CH)

( * ) Notice: Subject to any disclaimer, the term of this patent is extended or adjusted under 35 U.S.C. 154(b) by 943 days.

(21) Appl. No.: 10/529,533

(22) PCT Filed: Sep. 9, 2003

(86) PCT No.: PCT/CH03/00609

§ 371 (c)(1),
(2), (4) Date: Apr. 19, 2005

(87) PCT Pub. No.: WO2004/032175

PCT Pub. Date: Apr. 15, 2004

(65) Prior Publication Data

US 2006/0150908 A1    Jul. 13, 2006

(30) Foreign Application Priority Data

Oct. 3, 2002    (CH) ..................................... 1652/02

(51) Int. Cl.
*C23C 16/00*    (2006.01)
(52) U.S. Cl. ...................................... 118/718
(58) Field of Classification Search .................. 118/718
See application file for complete search history.

(56) References Cited

U.S. PATENT DOCUMENTS 3,884,787 A * 5/1975 Kuehnle ................. 204/192.12

(Continued)

FOREIGN PATENT DOCUMENTS

DE    37 35 162 A1    4/1988

(Continued)

OTHER PUBLICATIONS

Patent Abstracts of Japan, Transparent Heat Reflecting Plate, Publication No. 63112441, Publication Date: May 17, 1988.

(Continued)

*Primary Examiner*—Ram N Kackar
*Assistant Examiner*—Keath T Chen
(74) *Attorney, Agent, or Firm*—Rankin, Hill & Clark LLP

(57) ABSTRACT

A device for treating a web material in a continuous plasma enhanced process includes a vacuum chamber (1) with device (2) for maintaining a constant reduced pressure within the chamber (1) and, arranged within the chamber (1), a rotating drum (3) for supporting and transporting the web (4), a magnetron device facing the web (4) supported and transported by the drum (3) and a gas supply device for supplying a process gas or process gas mixture to the space (10) between the drum and the magnetron device in which space (10) the plasma is sustained. The magnetron device has a plurality of independent magnetron electrodes (6) with rectangular magnetron faces arranged beside each other in parallel. Each magnetron electrode (6) is individually powered with an alternating voltage by its own power supply (7). The drum (3) is electrically grounded, floating or negatively biased.

7 Claims, 4 Drawing Sheets

U.S. PATENT DOCUMENTS

| | | | |
|---|---|---|---|
| 4,322,276 A | | 3/1982 | Meckel et al. |
| 4,738,761 A | * | 4/1988 | Bobbio et al. .......... 204/192.12 |
| 4,885,070 A | | 12/1989 | Campbell et al. |
| 5,224,441 A | | 7/1993 | Felts et al. |
| 5,322,605 A | * | 6/1994 | Yamanishi ............. 204/298.07 |
| 5,339,584 A | * | 8/1994 | Ohtake et al. ................. 52/208 |
| 5,879,519 A | * | 3/1999 | Seeser et al. ........... 204/192.12 |
| 6,168,698 B1 | * | 1/2001 | Szczyrbowski et al. 204/298.25 |
| 6,306,265 B1 | * | 10/2001 | Fu et al. ................ 204/192.12 |
| 6,380,684 B1 | | 4/2002 | Li et al. |
| 2001/0010207 A1 | * | 8/2001 | Yamamoto et al. .. 118/723 MW |
| 2002/0158616 A1 | * | 10/2002 | Kovalevski et al. ......... 323/331 |

FOREIGN PATENT DOCUMENTS

| | | |
|---|---|---|
| JP | 62-083471 | 4/1987 |
| JP | 03-087219 | 4/1991 |
| JP | 09-111460 | 4/1997 |
| JP | 9-324275 | 12/1997 |
| JP | 2001-035839 | 2/2001 |

OTHER PUBLICATIONS

Patent Abstracts of Japan, Method for Plasma Treatment of Organic Substrate and Method for Forming Metal Layer on Organic Substrate, Publication No. 11092579, Publication Date: Sep. 19, 1997.

* cited by examiner

METHOD FOR THE TREATMENT OF A WEB-TYPE MATERIAL IN A PLASMA-ASSISTED PROCESS

BACKGROUND OF THE INVENTION

1. Field of the Invention

The invention relates to a device for treating a web surface in a plasma enhanced process, it serves in particular for coating one surface of a web of a flexible material in a plasma enhanced chemical vapour deposition process, e.g. coating a web of polymer film or sheet material with silicon oxide in order to improve its barrier properties.

2. Description of Related Art

A device of the named kind is e.g. described in the publication EP-0605534 (or U.S. Pat. No. 5,224,441, BOC). The device comprises a powered electrode in the form of a rotating drum and a grounded shield shaped like about half a hollow cylinder and arranged to form together with the drum a space having a width of between 1 and 30 cm. On the side of the shield facing away from the drum a plurality of permanent magnets is arranged such that alternating magnetic poles face towards the drum. For supplying a process gas or process gas mixture to the gap between the drum and the shield, the device comprises a gas supply line extending parallel to the drum axis in a central part of the shield. The drum, the shield with the magnetic means and the gas supply line are arranged within a vacuum chamber comprising means for removing the supplied process gas from the chamber in order to maintain a constant reduced pressure within the chamber.

The web of flexible material is conveyed through the space between the drum and the shield being supported and transported by the drum, i.e. lying on the circumferential surface of the drum, while a plasma is maintained in this space by powering the drum with a high frequency alternating voltage and by supplying a process gas mixture to the plasma. The plasma enhanced process described in the named publication is a plasma enhanced chemical vapour deposition of silicon oxide on a polymer film using a process gas mixture comprising an organosilicon compound, oxygen and an inert gas.

Another device for treating a web of flexible material in a plasma enhanced process is described in the publication U.S. Pat. No. 4,968,918 (Kondo et al.). The device comprises a plurality of stationary antenna electrodes extending radially from a central power introducing member and being arranged in a substantially cylindrical vacuum chamber. A grounded counter electrode is arranged between each two neighbouring antenna electrodes. Gas feed lines extend axially e.g. along the outer rim of the grounded electrodes. The web of flexible material is guided in a sort of zig-zag-path between the antenna electrodes and grounded electrodes either supported by the antenna electrodes or by the grounded electrodes. The process being carried out with the described device is an etching process using oxygen as a process gas, a plasma polymerisation, a chemical vapour deposition or the like.

SUMMARY OF THE INVENTION

It is the object of the invention to create a device for treating a web material in a plasma enhanced process which device is able to be operated more efficiently and more reliably than known devices for carrying out similar processes. Furthermore, the device is to be of a simple design allowing simple operation and simple maintenance.

The device according to the invention comprises within a vacuum chamber a rotating drum (or equivalent means) equipped for supporting and transporting the web material lying against part of its circumferential surface and further equipped to function as one of the pair of electrodes between which the plasma is to be confined. The device further comprises within the vacuum chamber a plurality of further electrodes being equipped for a magnetron function, i.e. devices comprising means for establishing an alternating electric field suitable for maintaining a plasma and means for establishing a magnetic field suitable for confining electrically charged particles at least partly in the plasma, in particular the electrons. The magnetron electrodes are arranged to form together with the drum a space along part of the circumferential surface of the drum through which space the web is transported lying on the circumferential surface of the drum.

The magnetron electrodes have rectangular magnetron faces being spaced from the drum circumferential surface, their length extending parallel to the drum axis and their width extending substantially tangentially to the drum. The magnetron electrodes are arranged side by side such forming together with the circumferential surface of the drum the above named space which substantially has the form of a part of a hollow cylinder, the plasma being sustained in this space. Each one of the plurality of magnetron electrodes is powered by its own power supply. The drum electrode is electrically grounded, electrically floating or negatively biased.

Gas supply lines run parallel to the drum axis either between neighbouring magnetron faces or within the magnetron faces. The vacuum chamber further comprises means for pumping gas from the chamber in order to maintain a constant reduced pressure.

It is no condition for the inventive device that the web is supported and transported by a rotating drum. The drum function (support and transport means for the web and counter electrode to the magnetron electrodes) may also be taken over e.g. by a circulating belt faced in that case by a straight line of magnetron faces.

Experiments show that plasma enhanced chemical vapour deposition on a web is more efficient and more reliable when using the device according to the invention than is the case when using one of the known devices. The coatings produced using the device according to the invention show less quality variations. This is believed to be due to the fact that the plasma created with the aid of the plurality of independent magnetron electrodes being arranged close together is of a more homogeneous character than a similar plasma created between only two correspondingly larger electrode faces. E.g. in the device according to the above named publication EP-0605534 a plasma intensity increasing from the web entrance area to the web exit area is clearly visible. Corresponding experiments show that going along the path of the web through this plasma showing a strong intensity gradient, 10% of the coating is achieved in the first third of the path, 20% in the middle third and 70% in the last third ending at the web exit. In opposition to this, operation with a plurality of individually powered magnetron electrodes, the plasma along the web path has a homogeneous appearance and the deposition rate is substantially the same along the whole path.

Experiments also show that plasma enhanced chemical vapour deposition using a device according to the invention comprising individually powered magnetron electrodes facing the surface to be coated results in considerably less coating of these electrodes than is found on the grounded shield of the device according to the publication EP-0605534. This does not only mean higher coating efficiency on the film substrate but it also means that the inventive device needs less maintenance in the form of electrode cleaning, i.e. longer uninterrupted operation and/or less time necessary for such maintenance. Furthermore, cleaning and maintenance is kept simple if each magnetron which is not of a great weight is mounted slideably along an axial rail such that it can be easily extracted from and repositioned in its position facing the drum.

Furthermore, it is possible to operate the device according to the invention producing the same quality of coating with one or even more than one of the magnetron electrodes being out of operation if for achieving the same exposure time the rotation speed of the drum is reduced accordingly.

BRIEF DESCRIPTION OF THE DRAWINGS

Exemplified embodiments of the device according to the invention are described in connection with the following drawings, wherein.

DETAILED DESCRIPTION OF THE INVENTION

Figure 1:
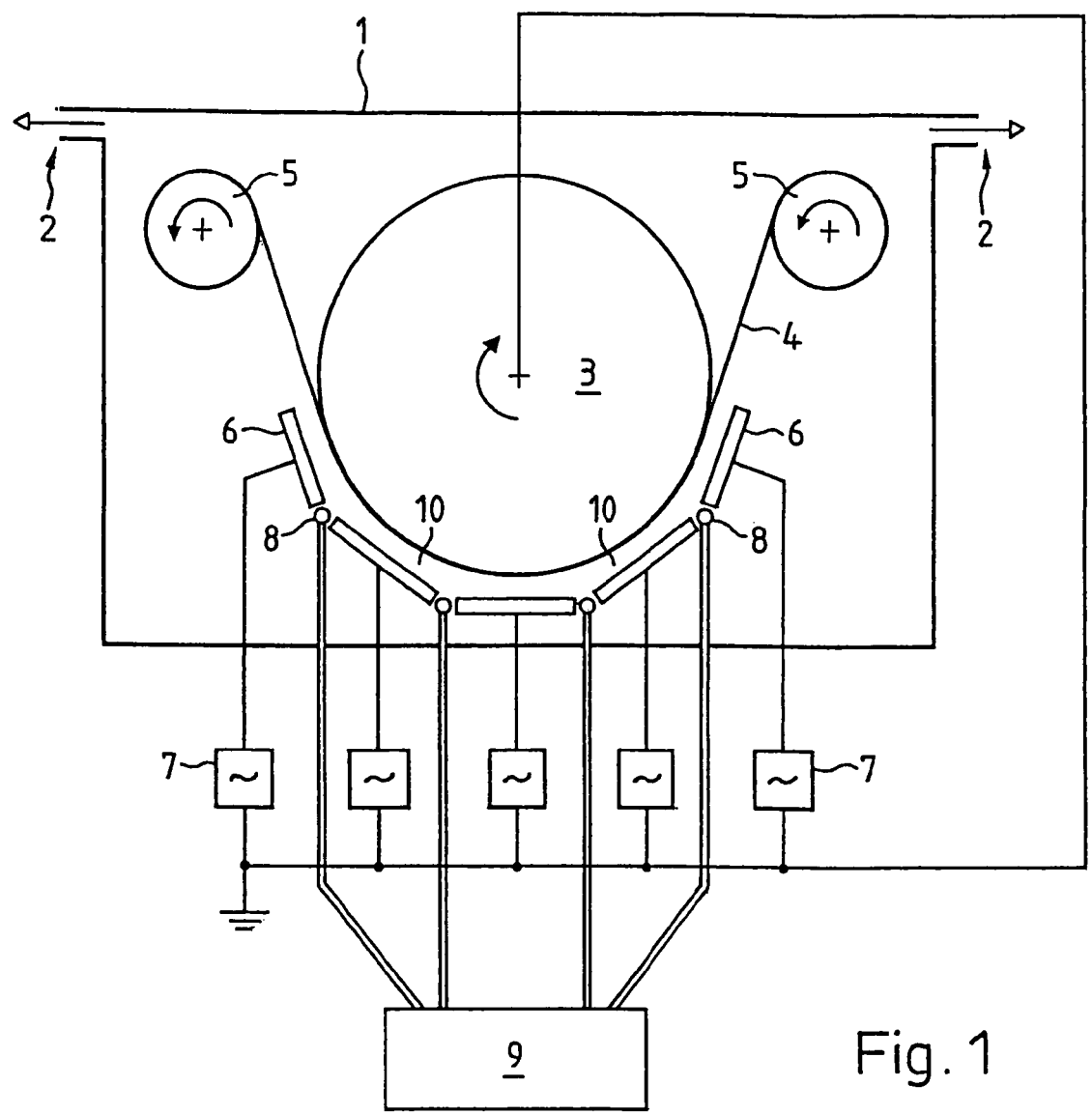
FIG. 1 is a schematic section perpendicular to the drum axis of an exemplified embodiment of the device according to the invention.

FIG. 1 shows in a very schematic manner the principal parts of the device according to the invention. These principal parts are: a vacuum chamber 1 with means 2 for removing gas in order to maintain a constant reduced pressure within the chamber 1, a rotating drum 3 arranged in the vacuum chamber 1 and serving for supporting and transporting the web 4 to be treated, two rolls 5 for supplying and receiving the web 4, the rolls 5 preferably being arranged also in the vacuum chamber, a plurality of magnetron electrodes 6 facing the circumferential surface of the drum 3 and being powered each by a separate power supply 7 (being connected to phase of the power supply 7), and gas supply lines 8 arranged substantially parallel to the drum axis and being connected to an e.g. common gas supply means 9 serving for supplying the process gas or process gas mixture.

The plasma is confined within the space 10 between the faces of the magnetron electrodes 6 and the drum circumferential surface.

Figure 2:
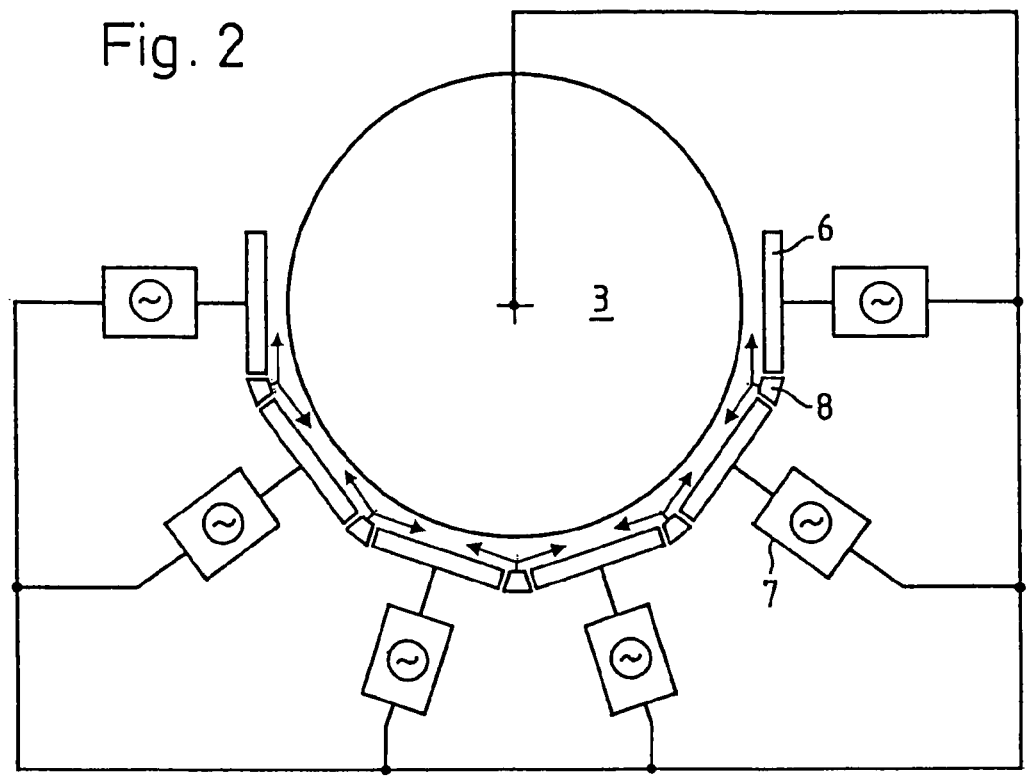
FIGS. 2 and 3 show two exemplified embodiments of the arrangement of the magnetron electrodes in a device according to the invention.
Figure 3:
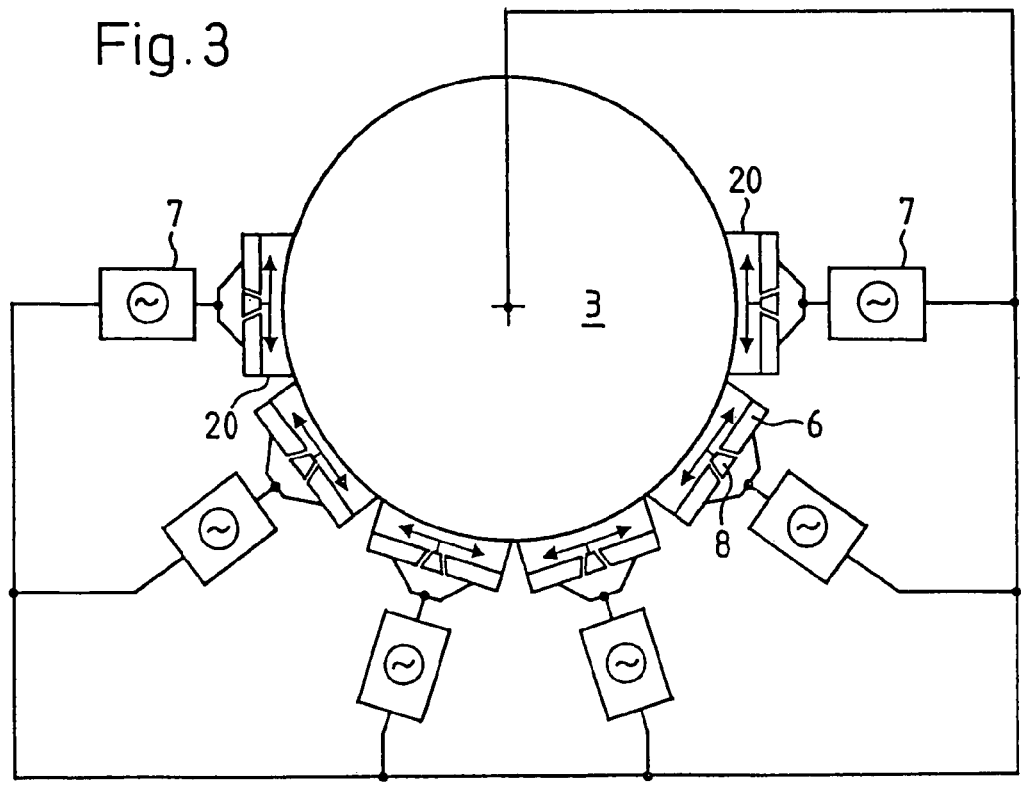

FIGS. 2 and 3 show two exemplified embodiments of arrangements of the magnetron electrodes 6 of the device according to the invention. The magnetron electrodes 6 are arranged around part of the drum circumferential surface and each one is powered by a separate power supply 7. The magnetron faces are rectangular, their length extending in axial direction of the drum and their width extending substantially tangentially. The width of each magnetron face is e.g. 15 cm, its length at least as large as the width of the web to be treated.

According to FIG. 2, the gas supply lines 8 (e.g. gas tubes comprising each a line of gas supply apertures) are arranged between each two magnetron faces and the gas is removed mainly along the length of the outermost magnetron faces in tangential direction and in axial direction. It is possible also to leave e.g. every second gap between two neighbouring magnetron faces without a gas supply line such that the gas is removed through these gaps also. The magnetrons 6 are e.g. of the kind as shown in the following FIGS. 4 and 5 and as described in connection with these figures.

According to FIG. 3, the magnetron electrodes are equipped with gas supply lines themselves, the gas supply lines running e.g. centrally along the length of the magnetron face. The gas is removed between neighbouring magnetron faces and in axial direction. As shown in FIG. 3 it is possible to further confine the plasma and the process gas to the space between each one of the magnetron electrodes and the drum by wall members 20 extending along the length of each magnetron face and closing the space between magnetron face and drum such that there is only a narrow slot between lateral wall member 20 and drum for the web to pass through unhindered. The process gas is removed mainly axially and partly through the named narrow lateral slots. The magnetron electrodes 6 are e.g. of the kind as illustrated in the following FIG. 6 or 7 and as described in connection with these figures.

The arrangement according to FIG. 3 is suitable either for carrying out one specific plasma enhanced treatment or, in particular when comprising the lateral wall members 20, a number of consecutive, differing plasma enhanced treatments using different process gas or process gas mixtures. Such consecutive processes are e.g. a preliminary cleaning or etching step, a following coating step and a final step for producing a coating surface having a desired wettability.

Typical operating parameters of a device according to FIG. 2 or 3 are e.g.: power: ca. 10-20 kW per m$^2$ of magnetron face; frequency: 40 kHz or 13.56 MHz; total length of web path within the plasma: 0.5 to 1 m; web speed 0.5 to 20 m/s. For coating a web with silicon oxide for improving its barrier properties, the exposure time is in the range of a few seconds, the process gas mixture comprises an organosilicon compound and oxygen and the pressure is maintained in the region of a few Pa.

Figure 4:
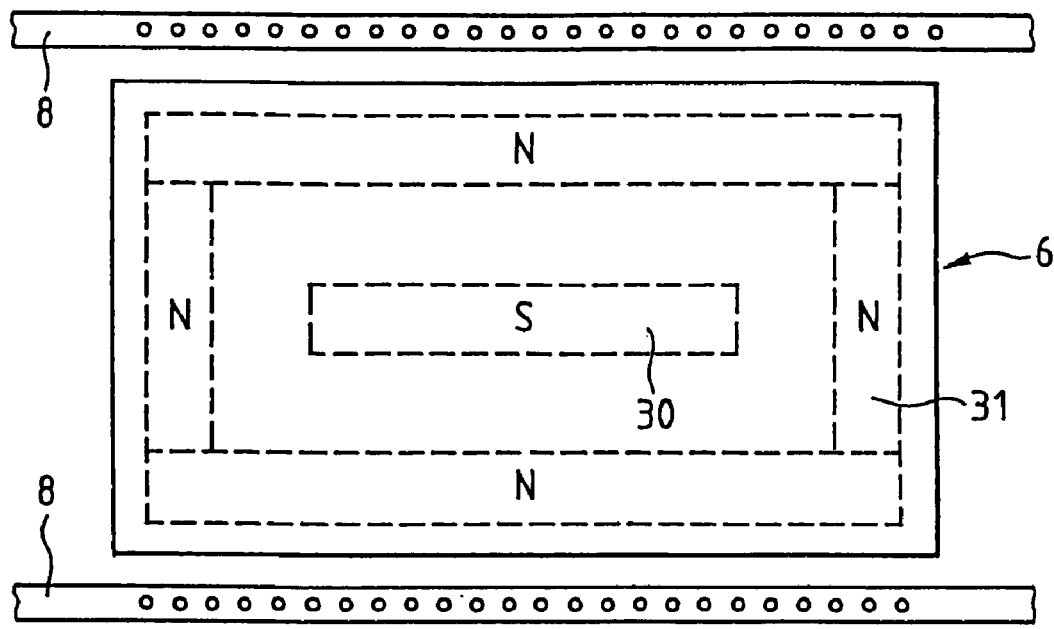
FIGS. 4 and 5 show the face and a section perpendicular to the face of an exemplified embodiment of a magnetron electrode applicable in the device according to the invention.
Figure 5:
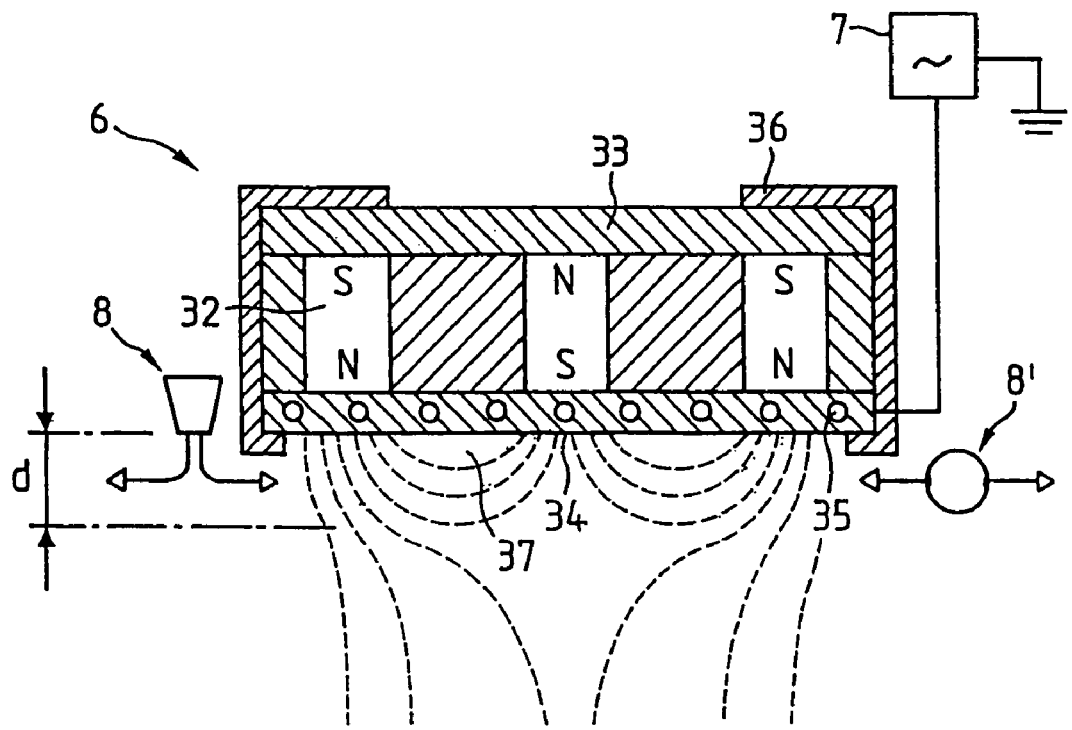

FIGS. 4 and 5 show the face (FIG. 4) and a section perpendicular to the face (FIG. 5) of an exemplified embodiment of a magnetron electrode applicable in the device according to the invention in particular in a device as shown in FIG. 2.

The magnetron face shows an arrangement of permanent magnetic poles comprising a central pole 30 and a peripheral pole 31 surrounding the central pole 30 and having an opposite polarity. The magnetic poles are e.g. poles of bar shaped permanent magnets 32 carrying their poles on opposite longitudinal sides. The poles of the permanent magnets facing away from the magnetron face are connected by a magnetic connecting piece 33 e.g. made of soft iron. The magnetron face is covered by a not magnetic electrode piece 34, e.g. made of stainless steal, aluminium or copper. The electrode piece is connected to the power supply unit 7. Advantageously, the electrode piece 34 is equipped for being cooled, e.g. it comprises channels 35 which are connected to a means for circulating a cooling medium through the channels. As also shown in FIG. 2, gas supply lines 8 are arranged along the longitudinal edges of the magnetron face. The gas supply lines are e.g. designed as tubes comprising rows of gas outlets or orifices arranged for gas injection substantially perpendicular to the magnetron faces (embodiment 8 as shown on the left hind side of the magnetron of FIG. 5) or substantially parallel to the magnetron faces (embodiment 8' as shown on the right hand side of the magnetron of FIG. 5).

As discussed further above, the magnetron electrode 6 is preferably mounted in rails 36, such that it can easily be removed from its operating position for being cleaned or for being replaced.

The central and peripheral magnetic poles 30 and 31 constituting the magnetron face are preferably dimensioned such that the central pole 30 and the peripheral pole 31 are of differing magnetic strength, i.e. such that the resulting magnetron is of the unbalanced type. This means that not all of the field lines extend from north to south pole of the magnetron face forming a tunnel 37 across the space between the poles and that therefore not all electrons are confined circling between the poles but are partly found outside the tunnels 37. A suitable magnetron effect for plasma enhanced chemical vapour deposition processes is e.g. achieved by using the above named bar magnets having the same strength for central and peripheral pole which results in a central magnetic strength which is substantially half of the peripheral magnetic strength.

Experiments show that, in particular for coating processes, it is advantageous to arrange the surface to be coated such that it is positioned just outside the tunnels 37, preferably at a distance d from the magnetron face which is between 2 and 20% larger than the height of the tunnel 37 above the magnetron face. The tunnel 37 is clearly visible as a darker area in the plasma space. The surface to be coated is to be arranged as close to the top of the tunnel but such that there is a visible band of bright plasma between the darker areas of the tunnel 37 and the surface to be coated and such that this bright plasma band has a homogenous brightness along its edge facing the surface to be coated, i.e. a brightness which is the same above the tunnels and above the spaces between the tunnels.

Figure 6:
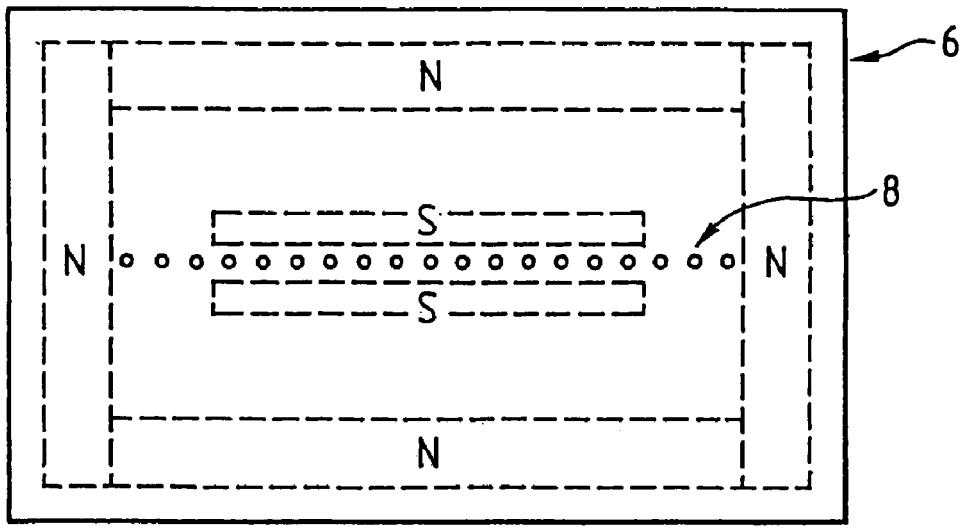
FIGS. 6 and 7 show faces of two further exemplified embodiments of magnetron electrodes applicable in the device according to the invention.
Figure 7:
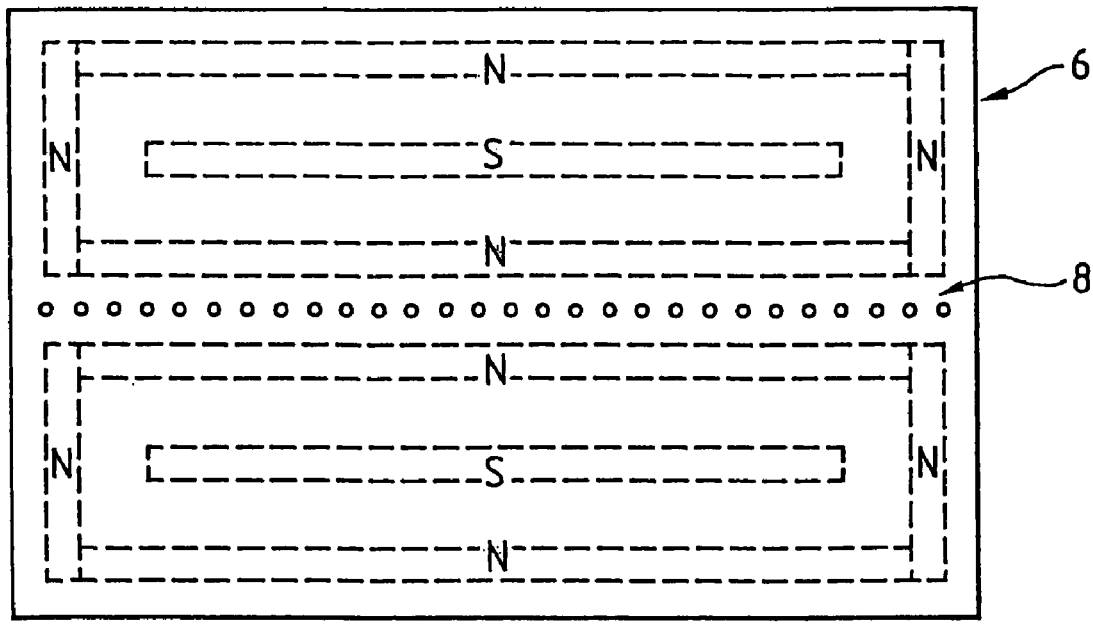

FIGS. 6 and 7 show exemplified magnetron faces applicable e.g. in devices according to the invention as shown in FIG. 3. Both magnetron electrodes 6 shown in FIGS. 6 and 7 comprise integrated gas supply lines 8 running centrally through the magnetron faces in parallel to their length. FIG. 6 shows a simple magnetron face with the gas supply line running between two halves of the central magnetic pole, FIG. 7 shows a twin magnetron face with a round track between central and peripheral poles on both sides of the gas supply line 8.

The invention claimed is:

1. A device for coating a web material in a single step plasma enhanced chemical vapor deposition process, the device comprising:
    a vacuum chamber (1) equipped for maintaining a constant reduced pressure therein and,
    arranged within the vacuum chamber (1) are,
        a rotating drum for supporting and continuously transporting a web material lying against a circumferential surface of the drum, the drum being one of electrically grounded, electrically floating, and negatively biased,
        more than two independent, substantially identical, magnetron electrodes (6) comprising:
            rectangular magnetron faces with a length and a width,
            a center pole and a peripheral pole, the two poles having opposite polarities and the peripheral pole extending around the center pole, and
            each magnetron electrode (6) being powered with an alternating voltage by its own power supply unit (7), and
        a plurality of gas supply lines,
    wherein the magnetron electrodes are arranged with the magnetron faces facing the circumferential surface of the drum and at a same distance therefrom, the lengths of the magnetron faces extending parallel to a drum axis and the widths of the magnetron faces extending substantially tangential to the circumferential surface, and
    wherein the gas supply lines extend between neighboring magnetron electrodes and comprise rows of gas outlets arranged for gas injection substantially perpendicular to the circumferential drum surface, wherein the magnetron faces and the gas supply lines are arranged side by side to form, together with a part of the circumferential surface of the rotating drum, one baffle-free combined process space and wherein the gas supply lines are connected to a source of only one process gas mixture.

2. The device according to claim 1, wherein the magnetron electrode (6) constitutes a twin magnetron.

3. The device according to claim 1, further comprising means for removing in an axial direction the gas supplied to the space (10) between magnetron faces and the rotating drum.

4. The device according to claim 1, wherein the magnetron faces comprise electrode pieces (34) of a non magnetic material extending over the magnetic poles constituting the magnetron face.

5. The device according to claim 4, wherein the electrode pieces (34) of the magnetron faces comprise channels (35) for receiving a cooling medium.

6. The device according to claim 1, wherein the magnetron electrodes (6) constitute magnetrons of an unbalanced type.

7. The device according to claim 6, wherein the magnetron faces comprise permanent magnetic central and peripheral poles (30 and 31), the central pole (30) having a magnetic strength that is about half of a magnetic strength of the peripheral pole (31).

* * * * *

UNITED STATES PATENT AND TRADEMARK OFFICE
CERTIFICATE OF CORRECTION

| | |
|---|---|
| PATENT NO. | : 7,806,981 B2 |
| APPLICATION NO. | : 10/529533 |
| DATED | : October 5, 2010 |
| INVENTOR(S) | : Fayet et al. |

It is certified that error appears in the above-identified patent and that said Letters Patent is hereby corrected as shown below:

On the Title Page, in Field (54), in Title, in Column 1, Line 1, delete "METHOD" and insert -- DEVICE --

Signed and Sealed this
Eighth Day of February, 2011

David J. Kappos
*Director of the United States Patent and Trademark Office*